US012610782B2

(12) United States Patent
Song et al.

(10) Patent No.: US 12,610,782 B2
(45) Date of Patent: Apr. 21, 2026

(54) SUPPORT UNIT AND APPARATUS FOR TREATING SUBSTRATE

(71) Applicant: SEMES CO., LTD.,
Chungcheongnam-do (KR)

(72) Inventors: Soo Han Song, Gyeonggi-do (KR);
Chul Goo Kim, Sejong-si (KR); Jung Bong Choi, Gyeonggi-do (KR);
Cheol-Yong Shin, Seoul (KR);
Jae-Youl Kim, Gyeonggi-do (KR)

(73) Assignee: SEMES CO., LTD.,
Chungcheongnam-Do (KR)

( * ) Notice: Subject to any disclaimer, the term of this patent is extended or adjusted under 35 U.S.C. 154(b) by 588 days.

(21) Appl. No.: 17/531,626

(22) Filed: Nov. 19, 2021

(65) Prior Publication Data

US 2022/0157645 A1 May 19, 2022

(30) Foreign Application Priority Data

Nov. 19, 2020 (KR) ........................ 10-2020-0155905

(51) Int. Cl.
*H10P 72/76* (2026.01)
*H10P 72/00* (2026.01)
(52) U.S. Cl.
CPC ...... *H10P 72/7624* (2026.01); *H10P 72/0404* (2026.01); *H10P 72/0434* (2026.01)
(58) Field of Classification Search
None
See application file for complete search history.

(56) References Cited

U.S. PATENT DOCUMENTS

| | | | | |
|---|---|---|---|---|
| 6,121,579 A | * | 9/2000 | Aoki | ..................... C23C 16/481 |
| | | | | 219/390 |
| 9,240,341 B2 | | 1/2016 | Serebryanov et al. | |
| 9,748,120 B2 | * | 8/2017 | Crabb | ............... H01L 21/67115 |
| 2004/0125593 A1 | * | 7/2004 | Nam | .................. H01L 21/67115 |
| | | | | 362/92 |
| 2012/0328273 A1 | | 12/2012 | Kawano et al. | |
| 2014/0054280 A1 | * | 2/2014 | Hohenwarter | ...... H01L 21/6715 |
| | | | | 219/400 |
| 2014/0102637 A1 | * | 4/2014 | Brugger | ............ H01L 21/67051 |
| | | | | 156/345.23 |
| 2015/0034133 A1 | * | 2/2015 | Kim | .................. H01L 21/67051 |
| | | | | 134/105 |

(Continued)

FOREIGN PATENT DOCUMENTS

| | | |
|---|---|---|
| JP | 1993-299350 A | 11/1993 |
| JP | 2003045817 A | 2/2003 |

(Continued)

*Primary Examiner* — Jeffrie R Lund
*Assistant Examiner* — Tiffany Z Nuckols
(74) *Attorney, Agent, or Firm* — PROCOPIO, CORY, HARGREAVES & SAVITCH LLP

(57) ABSTRACT

Provided is a support unit for supporting a substrate, the support unit including: a heating member configured to transmit thermal energy to a supported substrate; a reflective plate disposed under the heating member and configured to reflect thermal energy generated by the heating member to the substrate; a cooling plate disposed under the reflective plate and formed with a cooling flow path in which a cooling fluid flows; and a gas supply line configured to supply gas to a space between the reflective plate and the cooling plate.

20 Claims, 8 Drawing Sheets

(56)          References Cited

U.S. PATENT DOCUMENTS

2016/0013079 A1 * 1/2016 Choi ................. H01L 21/67051
                                                   156/345.21
2019/0311923 A1 * 10/2019 Kim ................... H01L 21/6708

FOREIGN PATENT DOCUMENTS

| JP | 2003-155175 | A | 5/2003 |
|----|-------------|---|--------|
| JP | 2008166706 | A | 7/2008 |
| JP | 2019009368 | A | 1/2019 |
| KR | 1020150015346 | A | 2/2015 |
| KR | 1020200060702 | A | 6/2020 |
| KR | 1020200074307 | A | 6/2020 |

* cited by examiner

FIG. 2

SUPPORT UNIT AND APPARATUS FOR TREATING SUBSTRATE

CROSS-REFERENCE TO RELATED APPLICATIONS

This application claims priority to and the benefit of Korean Patent Application No. 10-2020-0155905 filed in the Korean Intellectual Property Office on Nov. 19, 2020, the entire contents of which are incorporated herein by reference.

TECHNICAL FIELD

The present invention relates to a support unit and a substrate treating apparatus.

BACKGROUND ART

In general, in a process of treating a glass substrate or a wafer in a process of manufacturing a flat panel display device or a semiconductor, various processes, such as a photoresist coating process, a developing process, an etching process, and an ashing process, are performed. In each process, in order to remove various contaminants attached to the substrate, a wet cleaning process using a chemical solution or deionized water and a drying process for drying the chemical solution or the deionized water left on the surface of the substrate are performed.

Recently, a treatment process (for example, an etching process) of selectively removing a silicon nitride film and a silicon oxide film progresses by using chemical solutions, such as sulfuric acid or phosphoric acid, is performed. In a substrate treating apparatus using a chemical solution, a substrate treating apparatus which heats a substrate is used for improving efficiency of the treatment of the substrate. US Patent Application Publication No. 2016-0013079 discloses an example of the substrate treating apparatus. According to the Patent, the substrate treating apparatus includes a lamp that heats a substrate and a reflective plate that reflects radiated by the lamp within a spin head. When heat radiated by the lamp is transferred to the substrate, a temperature of the substrate increases and thus substrate treatment efficiency by the chemical is increased.

However, when the heat radiated by the lamp is transferred to a driving device of the spin head that rotates the substrate, a temperature of the driving device is increased. When the temperature of the driving device is increased, the driving device is not driven properly or a failure occurs in the driving device.

SUMMARY OF THE INVENTION

The present invention has been made in an effort to provide a support unit and a substrate treating apparatus which are capable of efficiently treating a substrate.

The present invention has also been made in an effort to provide a support unit and a substrate treating apparatus which minimize the transfer of heat generated by a heating member to a spin driving unit.

The present invention has also been made in an effort to provide a support unit and a substrate treating apparatus which minimize a boiling phenomenon of a cooling fluid flowing in a cooling flow path of a cooling plate.

The present invention has also been made in an effort to provide a support unit and a substrate treating apparatus which minimize inflow of a treatment liquid or impurities into an internal space of a chuck.

The present invention has also been made in an effort to provide a support unit and a substrate treating apparatus which minimize an excessive increase in a temperature of a power supply terminal that transmits power to a lamp.

The problem to be solved by the present invention is not limited to the above-mentioned problems, and the problems not mentioned will be clearly understood by those skilled in the art from the descriptions below.

An exemplary embodiment of the present invention provides a support unit for supporting a substrate, including: a heating member configured to transmit thermal energy to a supported substrate; a reflective plate disposed under the heating member and configured to reflect thermal energy generated by the heating member to the substrate; a cooling plate disposed under the reflective plate and formed with a cooling flow path in which a cooling fluid flows; and a gas supply line configured to supply gas to a space between the reflective plate and the cooling plate.

According to the exemplary embodiment, an upper surface of the cooling plate may have: a contact portion which is in contact with the reflective plate; and a spaced portion which is spaced apart from the reflective plate to form the space.

According to the exemplary embodiment, when viewed from above, a ratio of the contact portion to the spaced portion per unit area may be greater in an edge region of the cooling plate than a center region of the cooling plate.

According to the exemplary embodiment, the gas supply line may include: a first gas supply line which supplies the gas to the space; and a second gas supply line which supplies the gas to a lower portion of the cooling plate.

According to the exemplary embodiment, the support unit may further include: a chuck stage coupled to a spin driving unit to be rotatable; and a window which is disposed above the chuck stage, and is combined with the chuck stage to form an internal space in which the heating member, the reflective plate, and the cooling plate are disposed.

According to the exemplary embodiment, in a lateral surface of the window, a discharge hole through which the gas supplied by the gas supply line is discharged may be formed.

According to the exemplary embodiment, when viewed from above, in an edge region of the chuck stage, a blocking protrusion which blocks external impurities from being introduced into the internal space may be formed.

According to the exemplary embodiment, the blocking protrusion may be provided so as to surround the cooling plate when viewed from above, and an upper end of the blocking protrusion may be provided to be spaced apart from the reflective plate.

According to the exemplary embodiment, the spin driving unit may be provided with a hollow rotation shaft having a hollow space, and at least one of the gas supply line, a fluid supply line supplying the cooling fluid to the cooling flow path, and a fluid discharge line discharging the cooling fluid from the cooling flow path may be provided to the hollow space.

According to the exemplary embodiment, the chuck stage and the window may be coupled with each other to be rotated by rotation of the spin driving unit, and the heating member, the reflective plate, and the cooling plate may be positioned independently from the rotation of the chuck stage and the window.

Another exemplary embodiment of the present invention provides an apparatus for treating a substrate, the apparatus including: a support unit configured to support a substrate; and a liquid supply unit configured to supply a treatment liquid to the substrate supported by the support unit, in which wherein the support unit may include: a heating member configured to transmit thermal energy to the substrate supported by the support unit; a reflective plate disposed under the heating member and configured to reflect thermal energy generated by the heating member to the substrate; and a cooling plate disposed under the reflective plate and formed with a cooling flow path in which a cooling fluid flows, and an upper surface of the cooling plate may have: a contact portion which is in contact with the reflective plate; and a spaced portion which is spaced apart from the reflective plate to form a space.

According to the exemplary embodiment, the support unit may further include a gas supply line which supplies inert gas to the space.

According to the exemplary embodiment, the gas supply line may include: a first gas supply line which supplies the inert gas to the space; and a second gas supply line which supplies the inert gas to a lower portion of the cooling plate.

According to the exemplary embodiment, when viewed from above, a ratio of the contact portion to the spaced portion per unit area may be greater in an edge region of the cooling plate than a center region of the cooling plate.

According to the exemplary embodiment, the support unit may further include: a chuck stage coupled to a spin driving unit to be rotatable; and a window which is disposed above the chuck stage, and is combined with the chuck stage to form an internal space in which the heating member, the reflective plate, and the cooling plate are disposed.

According to the exemplary embodiment, in a lateral surface of the window, a discharge hole through which the inert gas supplied by the gas supply line is discharged may be formed.

According to the exemplary embodiment, when viewed from above, in an edge region of the chuck stage, a blocking protrusion which blocks external impurities from being introduced into the internal space may be formed.

Still another exemplary embodiment of the present invention provides an apparatus for treating a substrate, the apparatus including: a chamber having a treatment space; a support unit configured to support and rotate a substrate in the treatment space; and a liquid supply unit configured to supply a treatment liquid to the substrate supported by the support unit, in which the support unit may include: a chuck stage coupled to a spin driving unit to be rotatable; and a quarts window which is disposed above the chuck stage, and is combined with the chuck stage to form an internal space; a heating member disposed in the internal space and configured to transmit thermal energy to the substrate supported by the support unit; a reflective plate disposed under the heating member and configured to reflect thermal energy generated by the heating member to the substrate supported by the support unit; a cooling plate disposed under the reflective plate and formed with a cooling flow path in which a cooling fluid flows; and a gas supply line configured to supply inert gas to a space between the reflective plate and the cooling plate, and an upper surface of the cooling plate may have: a contact portion which is in contact with the reflective plate; and a spaced portion which is spaced apart from the reflective plate to form the space.

According to the exemplary embodiment, the heating members may be provided in plurality, and each of the heating members may be provided to have a ring shape, and a power supply terminal transmitting power to each of the heating members may be installed in the cooling plate.

According to the exemplary embodiment, in a lateral surface of the window, a discharge hole through which the inert gas supplied by the gas supply line is discharged may be formed, when viewed from above, in an edge region of the chuck stage, a blocking protrusion which blocks external impurities from being introduced into the internal space may be formed, the blocking protrusion may be provided so as to surround the cooling plate when viewed from above, and an upper end of the blocking protrusion may be provided to be spaced apart from the reflective plate.

According to the exemplary embodiments of the present invention, it is possible to efficiently process the substrate.

Further, according to the exemplary embodiments of the present invention, it is possible to minimize the transmission of heat generated by the heating member to the spin driving unit.

Further, according to the exemplary embodiments of the present invention, it is possible to minimize the boiling phenomenon of the cooling fluid flowing in the cooling flow path of the cooling plate.

Further, according to the exemplary embodiments of the present invention, it is possible to minimize the introduction of the treatment liquid into the internal space of the chuck.

Further, according to the exemplary embodiments of the present invention, it is possible to minimize the excessive increase in a temperature of a power supply terminal transmitting power to the lamp.

The effect of the present invention is not limited to the foregoing effects, and those skilled in the art may clearly understand non-mentioned effects from the present specification and the accompanying drawings.

BRIEF DESCRIPTION OF THE DRAWINGS

FIG. 2 is a top plan view of the substrate treating apparatus of FIG. 1.

DETAILED DESCRIPTION

Figure 1:
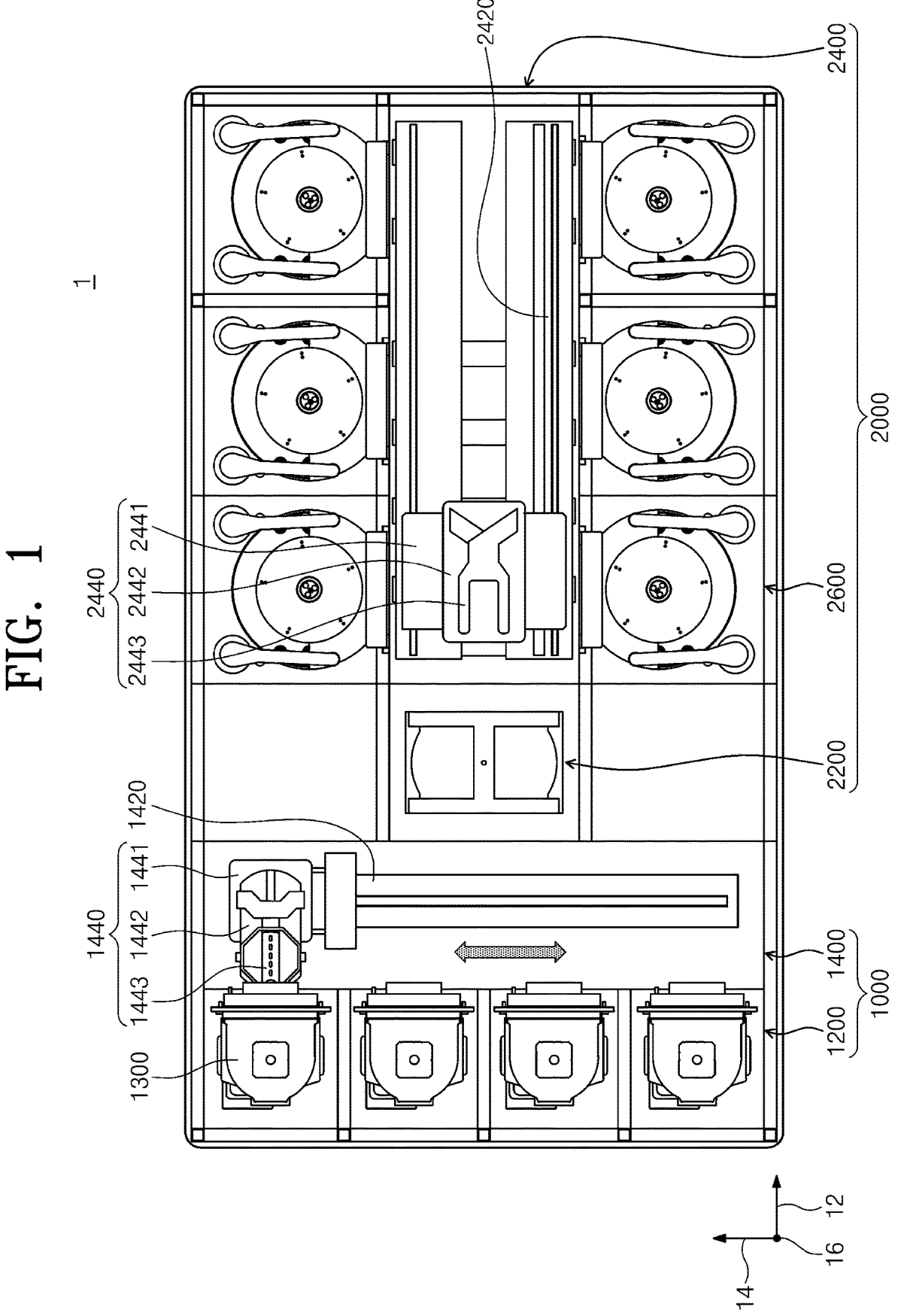
FIG. 1 is a top plan view schematically illustrating substrate treating equipment provided with a substrate treating apparatus according to an exemplary embodiment of the present invention.

Hereinafter, an exemplary embodiment of the present invention will be described more fully hereinafter with reference to the accompanying drawings, in which exemplary embodiments of the invention are shown. However, the present invention can be variously implemented and is not limited to the following embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations such as "comprises" or "comprising", will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance. Singular expressions used herein include plurals expressions unless they have definitely opposite meanings in the context. Accordingly, shapes, sizes, and the like of the elements in the drawing may be exaggerated for clearer description.

FIG. 1 is a top plan view schematically illustrating substrate treating equipment provided with a substrate treating apparatus according to an exemplary embodiment of the present invention. Referring to FIG. 1, substrate treating equipment 1 includes an index module 1000 and a process processing module 2000. The index module 1000 includes a load port 1200 and a transfer frame 1400. The load port 1200, the transfer frame 1400, and the process processing module 2000 are sequentially arranged in series. Hereinafter, a direction in which the load port 1200, the transfer frame 1400, and the process processing module 2000 are arranged is referred to as a first direction 12. When viewed above, a direction vertical to the first direction 12 is referred to as a second direction 14, and a direction vertical to a plane including the first direction 12 and the second direction 14 is referred to as a third direction 16.

A carrier 1300 in which a substrate W is accommodated is seated on the load port 1200. The load port 1200 is provided in plurality, and the plurality of load ports 1200 is arranged in series in the second direction 14. FIG. 1 illustrates that four load ports 1200 are provided. However, the number of load ports 1200 may also be increased or decreased according to process efficiency of the process processing module 2000 and a condition, such as foot print. A slot (not illustrated) provided to support an edge of the substrate W is formed in the carrier 1300. The slot is provided in plurality in the third direction 16. The substrates W are positioned in the carrier 1300 to be stacked while being spaced apart from each other in the third direction 16. As the carrier 1300, a Front Opening Unified Pod (FOUP) may be used.

The process processing module 2000 includes a buffer unit 2200, a transfer chamber 2400, and a process chamber 2600. A longitudinal direction of the transfer chamber 2400 is parallel to the first direction 12. Process chambers 2600 are disposed at one side and the other side of the transfer chamber 2400 in the second direction 14. The process chambers 2600 positioned at one side of the transfer chamber 2400 and the process chambers 2600 positioned at the other side of the transfer chamber 2400 are provided to be symmetric to each other based on the transfer chamber 2400. Some of the process chambers 2600 are disposed in the longitudinal direction of the transfer chamber 2400. Further, some of the process chambers 2600 are disposed to be stacked with each other. That is, the process chambers 2600 may be disposed in an arrangement of A×B (A and B are natural numbers equal to or greater than 1) at one side of the transfer chamber 2400. Herein, A is the number of process chambers 2600 provided in series in the first direction 12, and B is the number of process chambers 2600 provided in series in the third direction 16. When four or six process chambers 2600 are provided at one side of the transfer chamber 2400, the process chambers 2600 may be disposed in an arrangement of 2×2 or 3×2. The number of process chambers 2600 may be increased or decreased. Contrast to the foregoing, the process chambers 2600 may be provided only at one side of the transfer chamber 2400. Further, contrast to the foregoing, the process chambers 2600 may be provided only at one side and both sides of the transfer chamber 2400 in a single layer.

The buffer unit 2200 is disposed between the transfer frame 1400 and the transfer chamber 2400. The buffer unit 2200 provides a space in which the substrate W stays before the substrate W is transported between the transfer chamber 2400 and the transfer frame 1400. The buffer unit 2200 is provided with a slot (not illustrated) on which the substrate W is placed therein, and the slots (not illustrated) are provided in plurality so as to be spaced apart from each other in the third direction 16. In the buffer unit 2200, a surface facing the transfer frame 1400 and a surface facing the transfer chamber 2400 are opened.

The transfer frame 1400 transports the substrate W between the carrier 1300 seated on the load port 1200 and the buffer unit 2200. In the transfer frame 1400, an index rail 1420 and an index robot 1440 are provided. A longitudinal direction of the index rail 1420 is provided to be parallel to the second direction 14. The index robot 1440 is installed on the index rail 1420, and linearly moves in the second direction 14 along the index rail 1420. The index robot 1440 includes a base 1441, a body 1442, and an index arm 1443. The base 1441 is installed to be movable along the index rail 1420. The body 1442 is coupled to the base 1441. The body 1442 is provided to be movable in the third direction 16 on the base 1111. Further, the base 1442 is provided to be rotatable on the base 1441. The index arm 1443 is coupled to the body 1442, and is provided to be movable forward and backward with respect to the body 1442. A plurality of index arms 1443 is provided to be individually driven. The index arms 1443 are arranged to be stacked while being spaced apart from each other in the third direction 16. Some of the index arms 1443 may be used when the substrate W is transported from the process processing module 2000 to the carrier 1300, and the other may be used when the substrate W is transported from the carrier 1300 to the process processing module 2000. This may prevent particles generated from the substrate W before the process processing from being attached to the substrate W after the process processing in the process of loading and unloading the substrate W by the index robot 1440.

The transfer chamber 2400 transports the substrate W between the buffer unit 2200 and the process chamber 2600, and between the process chambers 2600. A guide rail 2420 and a main robot 2440 are provided to the transfer chamber 2400. The guide rail 2420 is disposed so that a longitudinal direction thereof is parallel to the first direction 12. The main robot 2440 is installed on the guide rail 2420, and linearly moves on the guide rail 2420 in the first direction 12. The main robot 2440 includes a base 2441, a body 2442, and a main arm 2113. The base 2441 is installed to be movable along the guide rail 2420. The body 2442 is coupled to the base 2441. The body 2442 is provided to be movable in the third direction 16 on the base 2441. Further, the base 2442 is provided to be rotatable on the base 2441. The main arm 2443 is coupled to the body 2442, and is provided to be movable forward and backward with respect to the body 2442. A plurality of main arms 2443 is provided to be individually driven. The main arms 2443 are arranged to be stacked while being spaced apart from each other in the third direction 16. The main arm 2443 used when the substrate W is transported from the buffer unit 2200 to the process chamber 2600 may be different from the main arm 2443 used when the substrate W is transported from the process chamber 2600 to the buffer unit 2200.

A substrate treating apparatus 10 performing a liquid treatment process (for example, a film removing process such as a washing process and an etching process) on the substrate W is provided in the process chamber 2600. The substrate treating apparatus 10 provided in each process chamber 2600 may have a different structure according to the type of washing process performed. Optionally, the substrate treating apparatus 10 in each process chamber 2600 may have the same structure. Optionally, the process chambers 2600 may be divided into a plurality of groups, and the substrate treating apparatuses 10 provided in the process chambers 2600 included in the same group may have the same structure, and the substrate treating apparatuses 10 provided in the process chambers 2600 included in the different groups may have the different structures. For example, when the process chambers 2600 are divided into two groups, the process chambers 2600 of a first group may be provided to one side of the transfer chamber 2400, and the process chambers 2600 of a second group may be provided to the other side of the transfer chamber 2400. Optionally, at each of the one side and the other side of the transfer chamber 2400, the process chambers 2600 of the first group may be provided to a lower layer, and the process chambers 2600 of the second group may be provided to an upper layer. The process chambers 2600 of the first group and the process chambers 2600 of the second group may be classified according to the type of chemical used or the type of cleaning method.

In the exemplary embodiment below, an apparatus for liquid-treating the substrate W by using treatment fluids, such as high-temperature sulfuric acid, high-temperature phosphoric acid, alkaline chemical solution, acidic chemical solution, rinsing liquid, and drying gas, will be described as an example. However, the technical spirit of the present invention is not limited thereto, and is applicable to all of various substrate treating apparatuses which perform a liquid treatment process by supplying a treatment liquid to the rotating substrate W.

Figure 2:
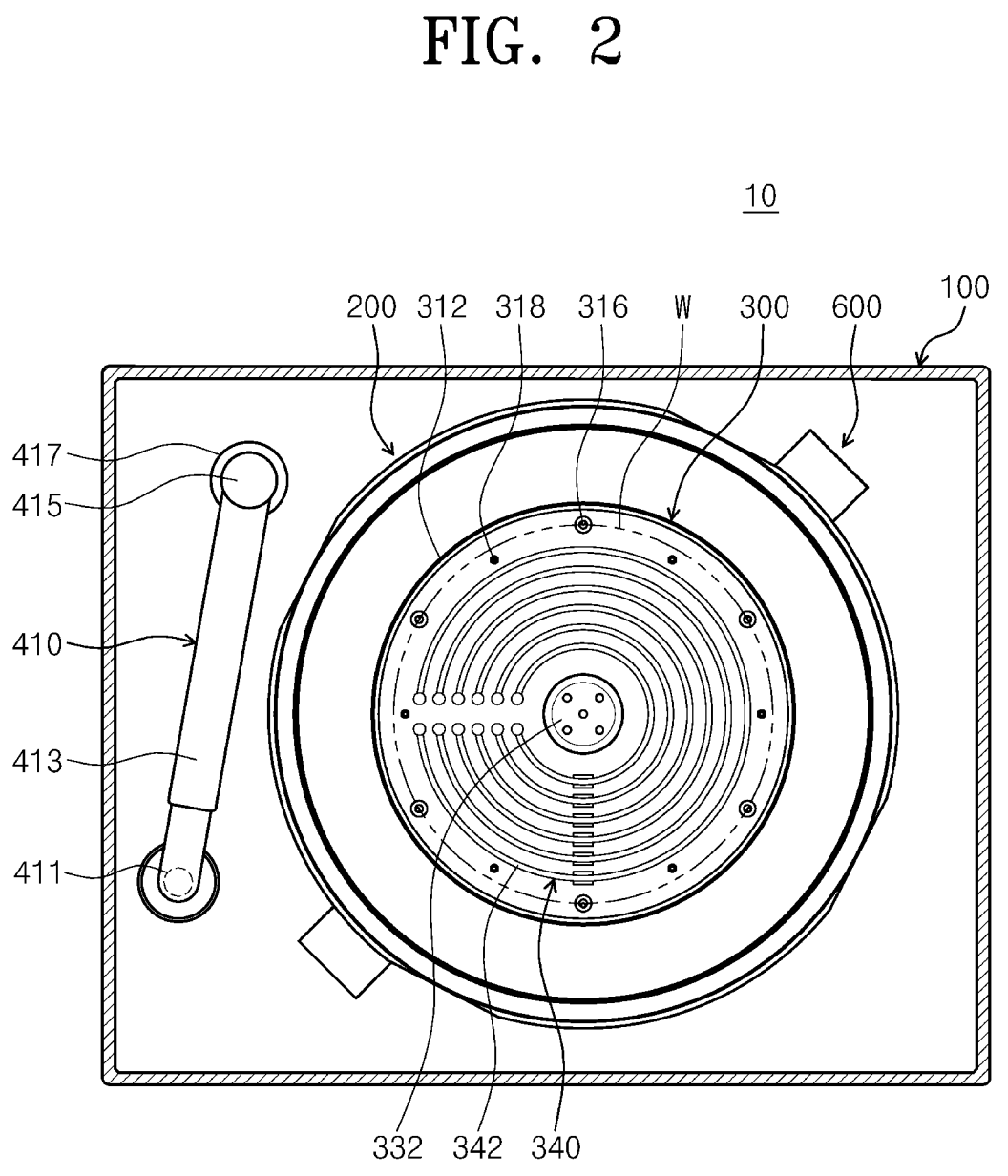
Figure 3:
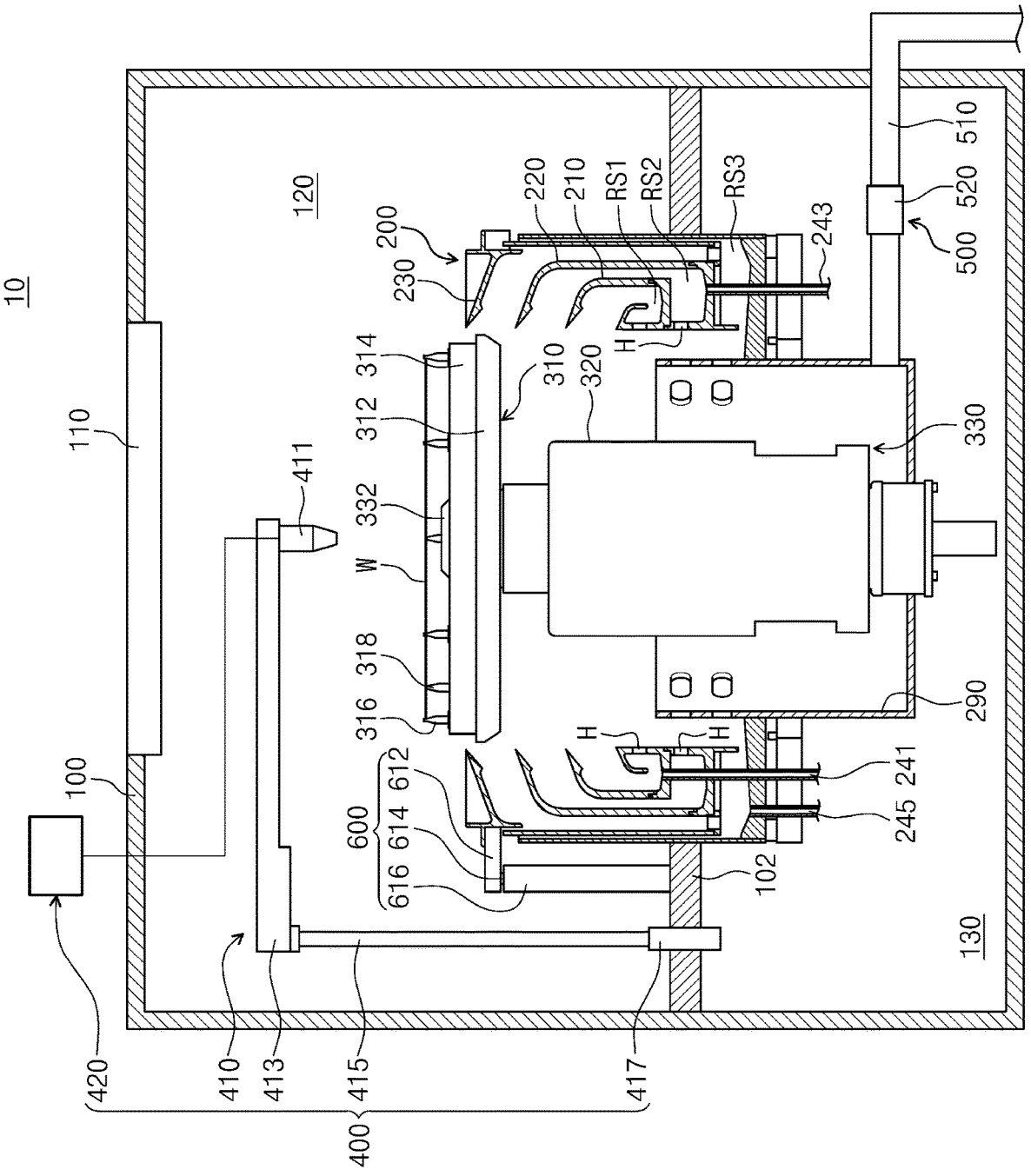
FIG. 3 is a cross-sectional view of the substrate treating apparatus of FIG. 1.

FIG. 2 is a top plan view of the substrate treating apparatus of FIG. 1, and FIG. 3 is a cross-sectional view of the substrate treating apparatus of FIG. 1. Referring to FIGS. 2 and 3, the substrate treating apparatus 10 includes a chamber 100, a bowl 200, a support unit 300, a liquid supply unit 400, an exhaust unit 500, and a lifting unit 600.

The chamber 100 provides a sealed internal space. An airflow supply member 110 is installed on an upper portion of the chamber 100. The airflow supply member 110 forms descending airflow inside the chamber 100. The airflow supply member 110 filters high-humidity external air and supplies the filtered external air into the chamber 100. The high-humidity external air passes through the airflow supply member 110 and is supplied into the chamber 100 to form descending airflow. The descending airflow provides uniform airflow to the upper portion of the substrate W, and discharges contaminant materials generated in the process of treating the surface of the substrate W by the treatment fluid to the exhaust unit 500 through recovery containers 210, 220, and 230 of the bowl 200 together with air.

The internal space of the chamber 100 is divided into a process region 120 (an example of a treatment space) and a maintenance and repair region 130 by a horizontal partition wall 102. In the process region 120, the bowl 200 and the support unit 300 are located. In the maintenance and repair region 130, in addition to recovery lines 241, 243, and 245 connected with the bowl 200, and the exhaust line, a driving unit of the lifting unit 600, a driving unit of the liquid supply unit 300, a supply line, and the like are located. The maintenance and repair region 130 is isolated from the process region 120.

The bowl 200 has a cylindrical shape having an open upper portion, and has a treatment space for treating the substrate W. The opened upper surface of the bowl 200 is provided as a loading and unloading passage of the substrate W. The support unit 300 is located in the treatment space. The support unit 300 rotates the substrate W in the state of supporting the substrate W during the progress of the process.

The bowl 200 provides a lower space connected with an exhaust duct 290 to a lower end so that forced exhaust is made. In the bowl 200, the first colleting container 210, the second recovery container 220, and the third recovery container 230 for introducing and sucking the treatment liquid and gas scattered on the rotating substrate W are disposed in a multi-stage.

The annular first recovery container 210, second recovery container 220, and third recovery container 230 have exhaust ports H communicating with one common annular space. In particular, each of the first to third recovery containers 210, 220, and 230 has a bottom surface having an annular ring shape and a lateral wall extending from the bottom surface in an upper direction and having a cylindrical shape. The second recovery container 220 surrounds the first recovery container 210, and is spaced apart from the first recovery container 210. The third recovery container 230 surrounds the second recovery container 220, and is spaced apart from the second recovery container 220.

The first colleting container 210, the second recovery container 220, and the third recovery container 230 may provide a first recovery space RS1, a second recovery space RS2, and a third recovery space RS3 to which the treatment liquid scattered from the substrate W and the airflow including fume is introduced. The first recovery space RS1 is defined by the first recovery container 210, the second recovery space RS2 is defined by a spaced space between the first recovery container 210 and the second recovery container 220, and the third recovery space RS3 is defined by a spaced space between the second recovery container 220 and the third recovery container 230.

An upper surface of each of the first recovery container 210, the second recovery container 220, and the third recovery container 230 has an opened center portion. The first recovery container 210, the second recovery container 220, and the third recovery container 230 are formed of inclined surfaces whose distance from the corresponding bottom surface gradually increases from the connected lateral wall to the open portion. The treatment liquid scattered from the substrate W flows into the first recovery space RS1, the second recovery space RS2, and the third recovery space RS3 along the upper surfaces of the first recovery container 210, the second recovery container 220, and the third recovery container 230.

A first treatment liquid introduced into the first recovery space RS1 is discharged to the outside through the first recovery line 241. A second treatment liquid introduced into the second recovery space RS2 is discharged to the outside through the second recovery line 143. A third liquid introduced into the third recovery space RS3 is discharged to the outside through the third recovery line 145.

The liquid supply unit 400 may treat the substrate W by supplying the treatment liquid to the substrate W. The liquid supply unit 400 may supply the heated treatment liquid to the substrate W. The treatment liquid may treat the surface of the substrate W. The treatment liquid may be a high-temperature chemical for etching the substrate W, such as removing a thin film on the substrate W. For example, the chemical may be sulfuric acid, phosphoric acid, or a mixture of sulfuric acid and phosphoric acid. The liquid supply unit 400 may include a liquid nozzle member 410 and a supply unit 420.

The liquid nozzle member 410 may include a nozzle 411, a nozzle arm 413, a support rod 415, and a nozzle driving unit 417. The nozzle 411 may receive the treatment liquid from the supply unit 420. The nozzle 411 may discharge the treatment liquid to the surface of the substrate W. The nozzle arm 413 is an arm provided with a long length in one direction, and the nozzle 411 is mounted at a front end of the nozzle arm 413. The nozzle arm 413 supports the nozzle 411. The support rod 415 is mounted to a rear end of the nozzle arm 413. The support rod 415 is located in the lower portion of the nozzle arm 413. The support rod 415 is disposed to be perpendicular to the nozzle arm 413. The nozzle driving unit 417 is provided at the lower end of the support rod 415. The nozzle driving unit 417 rotates the support rod 415 about the longitudinal direction axis of the support rod 415. The nozzle arm 413 and the nozzle 411 swings to the support rod 415 through the rotation of the support rod 415. The nozzle 411 may swing between an external side and an internal side of the bowl 200. Further, the nozzle 411 may discharge the treatment liquid while swing a section between the center region and the edge region of the substrate W.

The exhaust unit 500 may exhaust the inside of the bowl 200. For example, the exhaust unit 500 may provide exhaust pressure (sucking pressure) to the recovery container that recovers the treatment liquid among the first recovery container 210, the second recovery container 220, and the third recovery container 230 during the process. The exhaust unit 500 may include an exhaust line 510 and a damper 520 connected with the exhaust duct 290. The exhaust line 510 receives exhaust pressure from an exhaust pump (not illustrated) and is connected with a main exhaust line embedded in a bottom space of a semiconductor production line.

In the meantime, the howl 200 is coupled with the lifting unit 600 which changes a vertical position of the bowl 200. The lifting unit 600 linearly moves the bowl 200 in a vertical direction. According to the vertical movement of the bowl 200, a relative height of the bowl 200 with respect to the support unit 300 is changed.

The lifting unit 600 includes a bracket 612, a movement shaft 614, and a driving unit 616. The bracket 612 is fixed and installed on an external wall of the bowl 200. The movement shaft 614 which moves in the vertical direction by the driving unit 616 is fixedly coupled to the bracket 612. When the substrate W is loaded to or unloaded from the support unit 300, the bowl 200 moves down so that the support unit 300 protrudes above the bowl 200. Further, when the process progresses, a height of the bowl 200 is adjusted so that the treatment liquid is introduced into the predetermined recovery containers 210, 220, and 230 according to the type of treatment liquid supplied to the substrate W. The bowl 200 may make types of treatment liquid and pollutant gas recovered in each of the recovery spaces RS1, RS2, and RS3 be different from each other.

Figure 4:
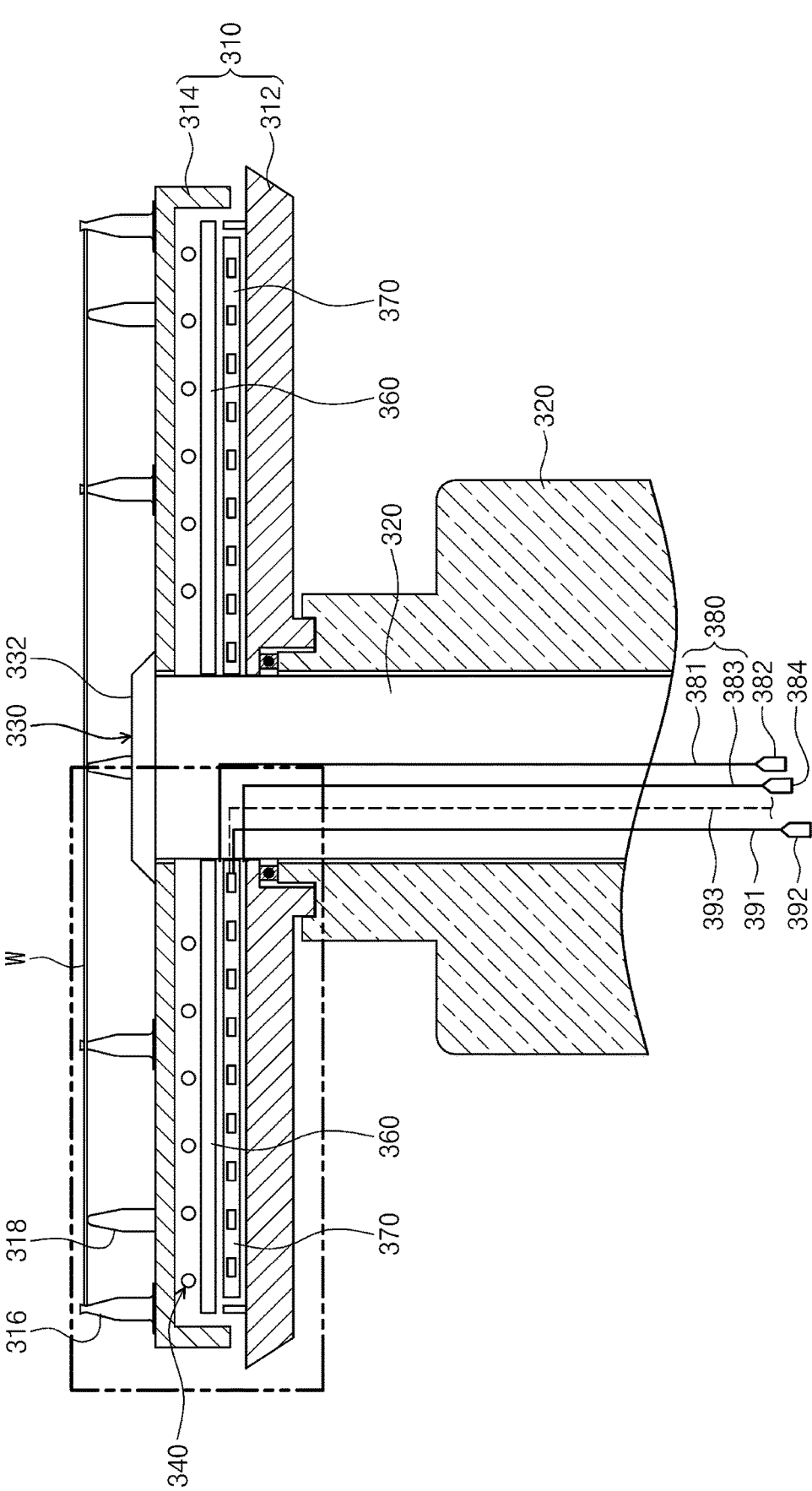
FIG. 4 is a cross-sectional view of an exemplary embodiment of a support unit of FIG. 3.
Figure 5:
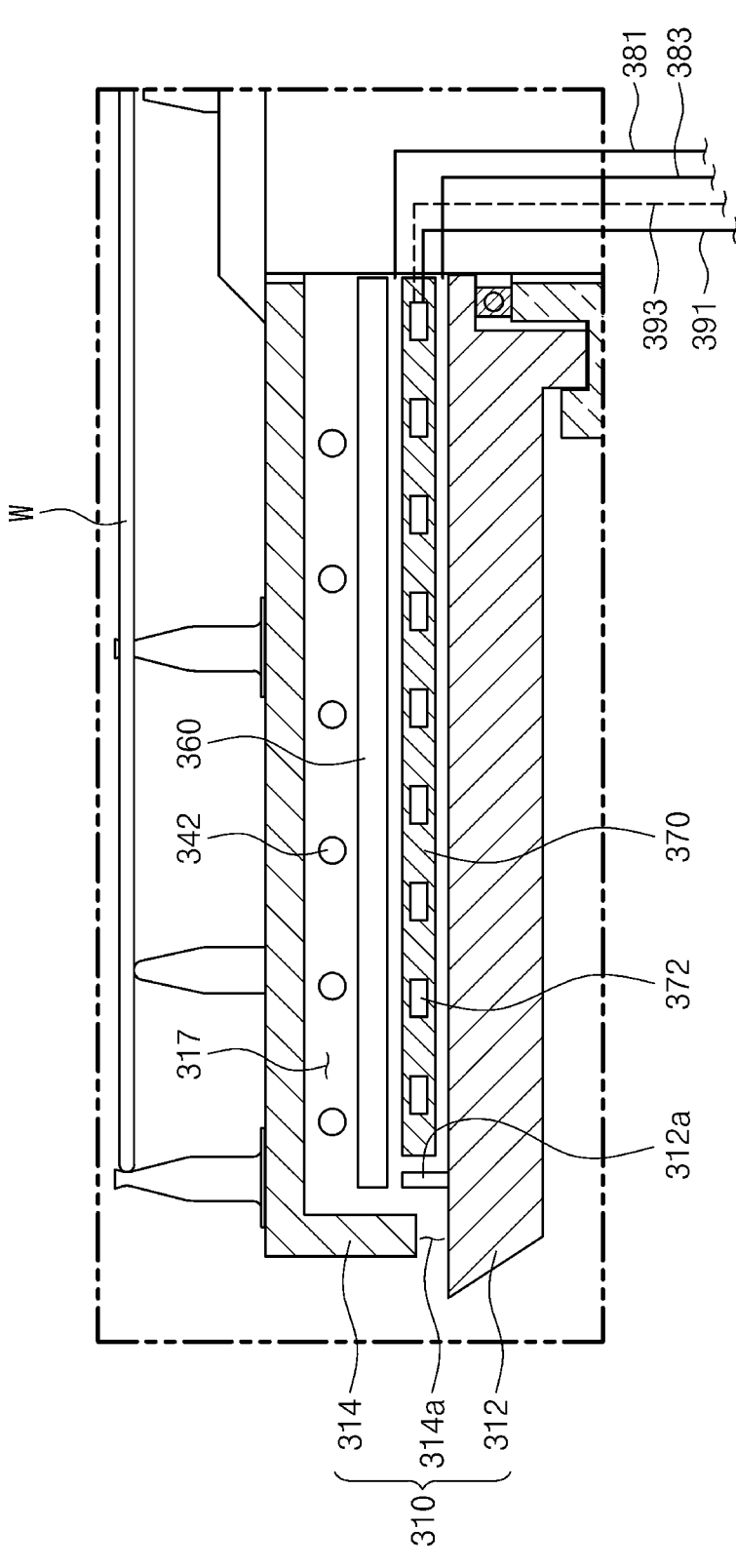
FIG. 5 is an enlarged view of one portion of the support unit of FIG. 4.

FIG. 4 is a cross-sectional view of an exemplary embodiment of the support unit of FIG. 3, and FIG. 5 is an enlarged view of a portion of the support unit of FIG. 4. Referring to FIGS. 4 and 5, the support unit 300 may support the substrate W during the process press and rotate the substrate W while the process progresses.

The support unit 300 may include a chuck 310, a spin driving unit 320, a back nozzle unit 330, a heating member 340, a reflective plate 360, a cooling plate 370, a gas supply line 380, a fluid supply line 391, and a fluid discharge line 393.

The chuck 310 may include a chuck stage 312 and a quartz window 314. The quartz window 314 may be disposed on the chuck stage 312.

The quartz window 314 may be provided so as to protect the heating member 340 which is to be described below. The chuck stage 312 and the quartz window 314 may be combined with each other to form an internal space 317. For example, the chuck stage 312 may be coupled with the spin driving unit 320 to have a rotatable plate shape. Further, the quartz window 314 may have a cover shape covering the chuck stage 312. The quartz window 314 may be coupled with the chuck stage 312. Accordingly, the quartz window 314 may be rotated together with the chuck stage 312.

The quartz window 314 may be made of a transparent material so as to allow light generated by the lamp 342, which is to be described below, to pass through. Further, when viewed from above, a diameter of the chuck stage 312 may be larger than a diameter of the quartz window 314.

Further, the quartz window 314 may have an upper surface and a lateral surface. The upper surface of the quartz window 314 may be provided so as to face the lower surface of the substrate W supported by the support unit 300. That is, the upper surface of the quartz window 314 may be the surface parallel to the lower surface of the substrate W supported by the support unit 300. Further, the lateral surface of the quartz window 314 may be formed to extend downwardly from the upper surface in an edge region of the quartz window 314. One or more outlet holes 314a through which inert gas is discharged may be formed in the lateral surface of the quartz window 314. For example, the outlet hole 314a may be the hole through which gas G supplied through the gas supply line 380 which is to be described below is discharged. The outlet holes 314a may be formed in the lateral surface of the quarts window 314, and may be formed while being spaced apart from each other at the same interval.

Further, the support pins 318 may be provided to the quarts window 314. The support pins 318 are disposed in an edge portion of the upper surface of the quarts window 314 while being spaced apart from each other at a predetermined interval. The support pin 318 is provided to protrude above from the quarts window 314. The support pins 318 support the lower surface of the substrate W, and the substrate W is supported while being spaced apart from the quartz window 314 in the upper direction.

Chucking pins 316 may be installed in the edge of the chuck stage 312. The chucking pins 316 are provided to protrude above the quartz window 314 while passing through the quarts window 314. The chucking pins 316 may align the substrate W so that the substrate W supported by the plurality of support pins 318 is placed at a correct position. When the process progresses, the chucking pins 316 may be in contact with the lateral portion of the substrate W to prevent the substrate W from being dislocated from the correct position.

Further, a blocking protrusion 312a may be formed in the chuck stage 312. The blocking protrusion 312a may block external impurities of the support unit 300 from being introduced into the internal space 317 of the chuck 310. The blocking protrusion 312a may have a ring shape when viewed from above. When viewed from above, the blocking protrusion 312a may be provided so as to surround the cooling plate 370 which is to be described below. Further, the blocking protrusion 312a may be provided so as to overlap the reflective plate 360 when viewed from above. Further, the blocking protrusion 312a may be provided so that the upper end of the blocking protrusion 312a is spaced apart from the reflective plate 360. A spaced space between the upper end of the blocking protrusion 312a and the reflective plate 360 may function as a discharge opening through which inert gas is discharged, which is to be described below.

The chuck stage 312 may be coupled to the spin driving unit 320 to be rotated. The spin driving unit 320 may be connected with a hollow motor, and may be provided with a hollow rotation shaft having a hollow space 322. In the hollow space 322, at least one of a gas supply line 380, a fluid supply line 391, a fluid discharge line 393, which are to be described below, may be provided. For example, in the hollow space 322, the gas supply line 380, the fluid supply line 391, and the fluid discharge line 393 may be provided.

When the chuck stage 312 rotates as described above, the quarts window 314 may be rotated together with the chuck stage 312. Further, the configurations provided in the chuck 310 may be located independently from the rotation of the chuck 310. For example, the heating member 340, the reflective plate 360, the cooling plate 370, the hollow space 322, the gas supply line 380, the fluid supply line 391, and the fluid discharge line 393, which are to be described below, may be located independently from the rotation of the chuck 310.

The back nozzle unit 330 is provided to inject a chemical solution to a rear surface of the substrate W. The back nozzle unit 330 may include a chemical solution injection unit 332 and a chemical solution supply line 336. The chemical solution supply line 336 may receive a chemical solution from the chemical solution supply unit 334 and transfer the received chemical solution to the chemical solution injection unit 332. The chemical solution injection unit 332 and the chemical solution supply line 336 may be located independently from the rotation of the chuck 310. The chemical solution injected by the chemical solution injection unit 332 may be an etchant for etching the lower surface of the substrate W.

The heating member 340 may heat the substrate W during the process progress. The heating member 340 may be disposed in the internal space 317 of the chuck 310. For example, the heating member 340 may be disposed in the internal space 317 of the chuck 310 defined by the chuck stage 312 and the quarts window 314. The heating member 340 may include a lamp 342, a temperature controller (not illustrated), and a power supply terminal 344.

The lamp 342 is installed in an upper portion of the chuck stage 312. The lamp 342 may generate thermal energy heating the substrate W supported by the support unit 300. The lamp 342 may heat the substrate W by irradiating the substrate W supported by the support unit 300 with light. The lamp 342 may be provided in plurality. At least some of the lamps 342 may have a ring shape. The lamp 342 may be generally provided in a ring shape. The lamps 342 may be provided with different diameters. Further, the lamps 342 may be provided in a concentric circle shape with the same center of rotation. Further, the lamps 342 may have the different radii with respect to the center of the chuck stage 312, and may be arranged while being spaced apart from each other so that the centers of the lamps 342 correspond to each other. Each lamp 342 is formed with the temperature controller, thereby controlling a temperature of each lamp 342. Further, the lamp 342 may be an Infrared Ray (IR) lamp. Accordingly, the lamp 342 my heat the substrate W by irradiating infrared light.

Further, the thermal energy generated by the lamp 342 (for example, the output of the light generated by the lamp 342) may be individually controlled. For example, each of the lamps 342 may be connected with the power supply terminal 344 which is to be described below via the plurality of power supply lines 345 which is to be described below. The heating member 340 may control a temperature of each individual zone to continuously increase or decrease the temperature according to the radius of the substrate W while the process progresses. In the present exemplary embodiment, six lamps 342 are illustrated, but this is merely an example, and the number of lamps 342 may be increased/decreased depending on a desired temperature and the degree of control.

The reflective plate 360 may be disposed under the heating member 340. The reflective plate 360 may be disposed under the lamp 342. The reflective plate 360 may reflect thermal energy generated by the lamp 342 to the substrate W. The reflective plate 360 may reflect the thermal energy generated by the lamp 342 to the edge region of the substrate W and/or the center region of the substrate W. The reflective plate 360 may be made of a material having high reflection efficiency to the thermal energy generated by the heating member 340. The reflective plate 360 may be made of a material having high reflection efficiency to the light irradiated by the lamp 342. For example, the reflective plate 360 may be made of a material including gold, silver, copper, and/or aluminum. For example, the reflective plate 360 may be made of a material in which quartz is coated with gold, silver, copper, and/or aluminum. The reflective plate 360 may be made of a material in which quartz is coated with gold, silver, copper, and/or aluminum by a Physical Vapor Deposition (PVD) method.

The cooling plate 370 may be disposed under the reflective plate 360. A cooling flow path 372 in which a cooling fluid flows may be formed in the cooling plate 370. The cooling flow path 372 may be connected with a fluid supply line 391 which supplies the cooling fluid to the cooling flow path 372, and a fluid discharge line 391 which discharges the cooling fluid from the cooling flow path 372. The fluid supply line 391 may receive the cooling fluid from the fluid supply source 392 and supply the cooling fluid to the cooling flow path 372. The cooling plate 370 may be made of a material having excellent thermal conductivity. For example, the cooling plate 370 may be made of a material including aluminum.

Figure 6:
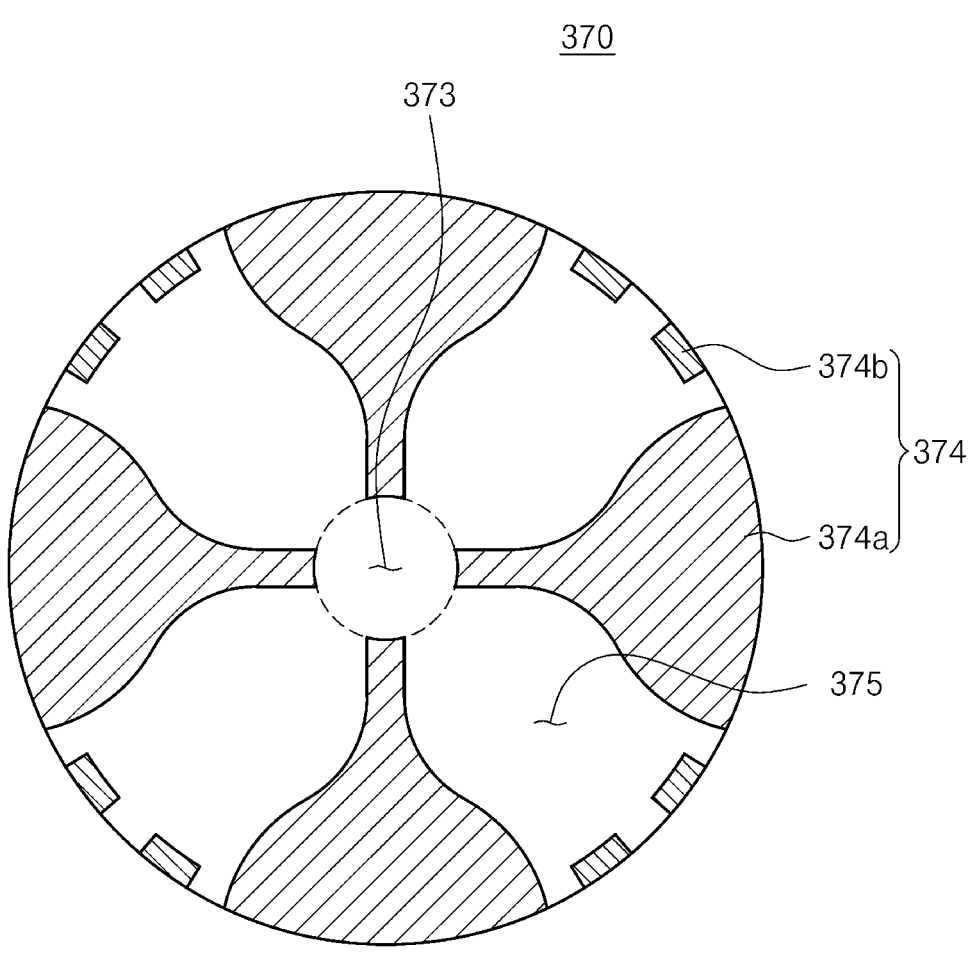
FIG. 6 is a diagram illustrating a cooling plate of FIG. 5 viewed from above.

Further, the cooling plate 370 may have a diameter smaller than that of the reflective plate 360 when viewed from above. Further, the cooling plate 370 may in contact with the reflective plate 360. Further, a partial region of the upper surface of the cooling plate 370 may be in contact with the reflective plate 360, and the other portion of the upper surface of the cooling plate 370 may be spaced apart from the reflective plate 360. For example, as illustrated in FIG. 6, an opening 373, a contact portion 374, and a spaced portion 375 may be formed in the cooling plate 370. The contact portion 374 in the upper surface of the cooling plate 370 may be in contact with a lower surface of the reflective plate 360. The spaced portion 375 in the upper surface of the cooling plate 370 may be spaced apart from the lower surface of the reflective plate 360 to form a space into which inert gas G, which is to be described below, is introduced. That is, the contact portion 374 may have a relatively larger height than that of the spaced portion 375. The spaced portion 375 may have a relatively smaller height than that of the contact portion 374. Further, when viewed from above, a ratio of the contact portion 374 to the spaced portion 375 per unit area may be greater in the edge region of the cooling plate 370 than the center region of the cooling plate 370. That is, the edge region of the cooling plate 370 may be in more contact with the reflective plate 360, and the center region of the cooling plate 370 may be in less contact with the reflective plate 360. This is because, since the quarts window 314 has the lateral surface, the edge region of the quarts window 314 holds more thermal energy generated by the lamp 342. Accordingly, since the temperature of the edge region of the reflective plate 360 is more likely to be higher than the temperature of the center region of the reflective plate 360, the cooling plate 370 has a structure in which the edge region is in more contact with the reflective plate 360.

Further, the contact portion 374 may include a first contact portion 374*a* and a second contact portion 374*b*. The first contact portion 374*a* may be formed to reach the edge region of the cooling plate 370 from the opening 373, and the second contact portion 374*b* may be formed in the edge region of the cooling plate 370. Further, the second contact portion 374*h* may be provided in plurality. The second contact portions 374*b* may be formed while being spaced apart from each other. Regions between the adjacent second contact portions 374*b*, and regions between the second contact portion 374*b* and the first contact portion 374*a* may function as discharge openings through which inert gas, which is to be described below, is discharged.

Referring back to FIGS. 4 and 5, the gas supply line 380 may supply gas G to the internal space 317 formed by the chuck stage 312 and the quarts window 314. The gas G supplied by the gas supply line 380 to the internal space 317 may be cooling gas. The gas G supplied by the gas supply line 380 to the internal space 317 may be inert gas. For example, the gas G may be inert gas including nitrogen, argon, and the like. However, the gas G is not limited thereto, and may be variously changed to the publicly known inert gas.

The gas supply line 380 may include a first gas supply line 381 and a second gas supply line 383. The first gas supply line 381 and the second gas supply line 383 may be in contact with a gas injection port (not illustrated). The first gas supply line 381 may receive the gas G from a first gas supply source 382 and supply the gas G to the space between the cooling plate 370 and the reflective plate 360. The second gas supply line 383 may receive the gas G from a second gas supply source 384 and supply the gas G to the lower region of the cooling plate 370.

Figure 7:
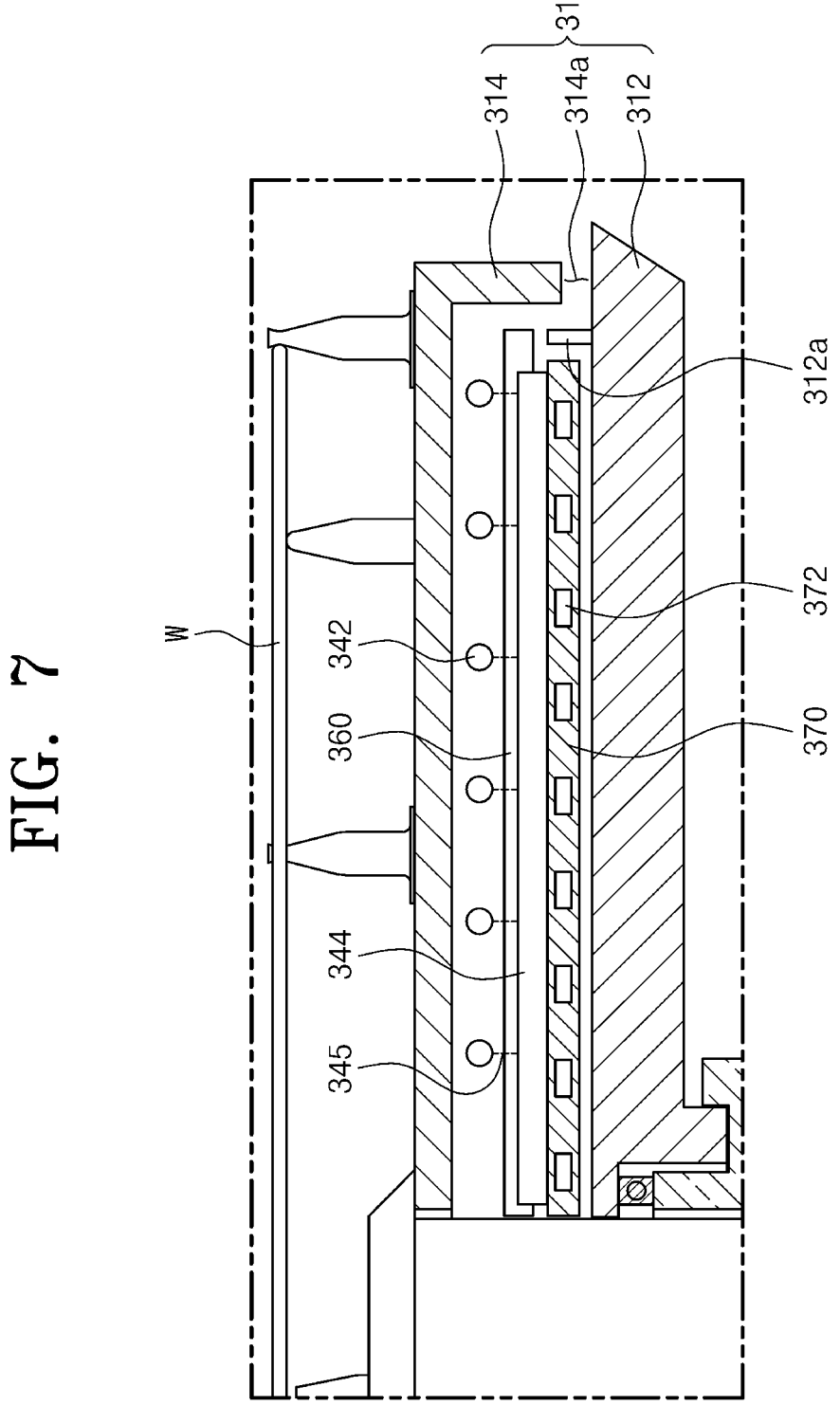
FIG. 7 is an enlarged diagram of another portion of the support unit of FIG. 4.

FIG. 7 is an enlarged diagram of another part of the support unit of FIG. 4. Referring to FIG. 7, the lamp 342 is provided in plurality as described above, and each lamp 342 may be provided so as to have a ring shape. Further, the lamps 342 may be provided in a concentric circular shape having the same center. Further, the lamps 342 may independently generate thermal energy as described above. Accordingly, each of the lamps 342 may be electrically connected with the power supply terminal 344 that transmits power to the lamps 342 through the different power supply lines 345. The power supply terminal 344 has a structure that is relatively vulnerable to heat, and when the power supply terminal 344 is installed in the cooling plate 370 as in the exemplary embodiment of the present invention (for example, the power supply terminal 344 is installed in an upper surface or a lower surface of the cooling plate 370), it is possible to prevent the temperature of the power supply terminal 344 from being excessively increased.

Figure 8:
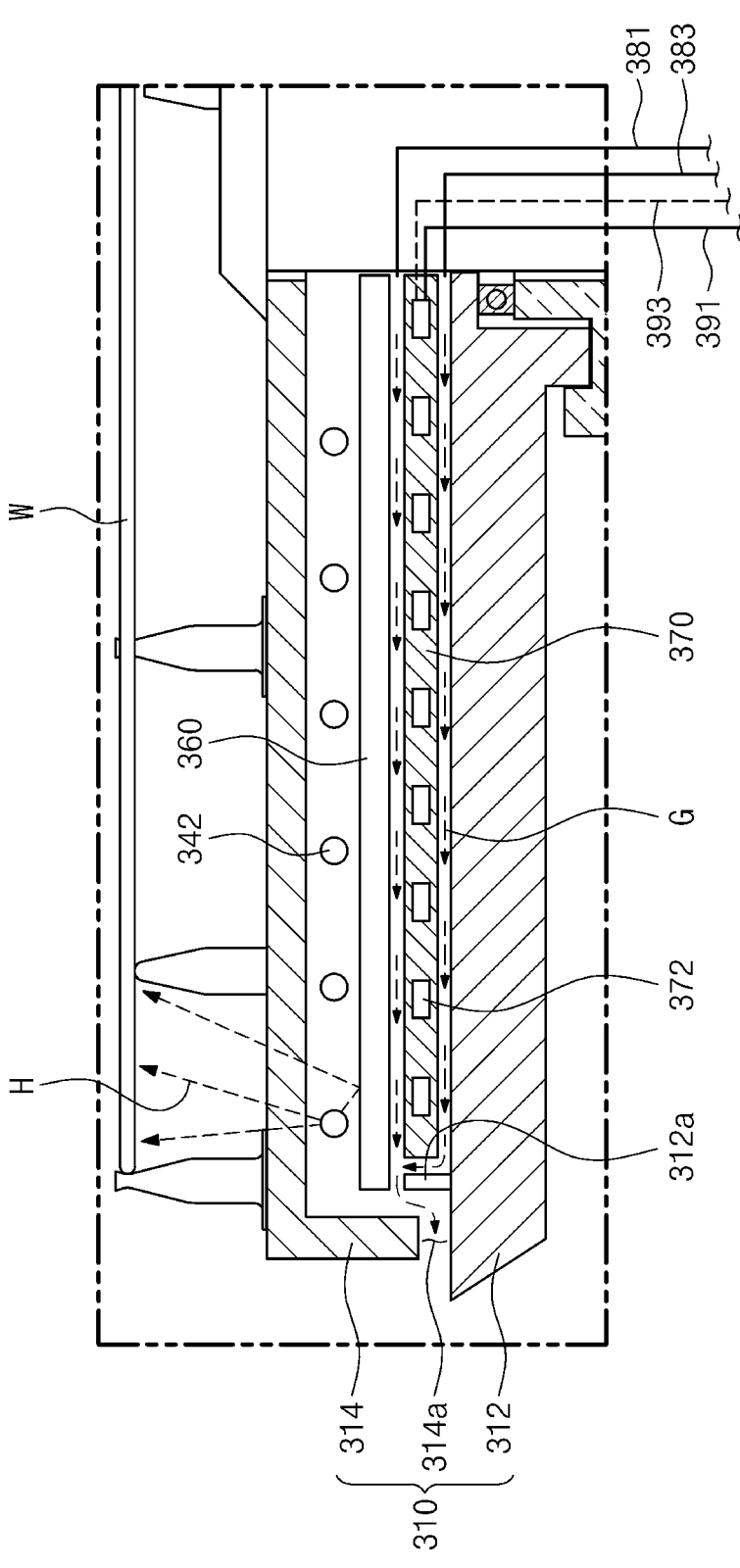
FIG. 8 is a diagram illustrating the case where the support unit of FIG. 4 heats a substrate.

FIG. 8 is a diagram illustrating the case where the support unit of FIG. 4 heats the substrate. Referring to FIG. 8, the thermal energy H generated by the lamp 342 may be directly transmitted to the substrate W, or may be reflected by the reflective plate 360 and indirectly transmitted to the substrate W. In this case, the temperature of the reflective plate 360 may be increased by the thermal energy H generated by the lamp 342. When the temperature of the reflective plate 360 is increased, the heat of the reflective plate 360 may be transmitted to the spin driving unit 320, and when a temperature of the spin driving unit 320 is increased, the driving of the spin driving unit 320 connected with the hollow motor may not be properly performed, or failure may occur in the hollow motor. Accordingly, it is very important to minimize the transmission of the heat of the reflective plate 360 heated by the lamp 342 to the spin driving unit 320. According to the exemplary embodiment of the present invention, cooling water may flow in the cooling flow path 372 of the cooling plate 370. Further, the cooling plate 370 may be in contact with the reflective plate 360. That is, the cooling plate 370 may prevent the temperature of the reflective plate 360 from being excessively increased by a water cooling type cooling method.

Depending on the case, the cooling water flowing in the cooling flow path 372 of the cooling plate 370 may be boiled by the heat of the reflective plate 360. Accordingly, the cooling plate 370 according to the exemplary embodiment of the present invention may include the contact portion 374 and the spaced portion 375. That is, the entire upper surface of the cooling plate 370 is not in contact with the lower surface of the reflective plate 360, and the partial region of the upper surface of the cooling plate 370 is in contact with the reflective plate 360. Further, in the other region of the upper surface of the cooling plate 370 that is not in contact with the reflective plate 360 and the space between the upper surface of the cooling plate 370 and the lower surface of the reflective plate 360, the inert gas G supplied by the gas supply line 380 may flow. The inert gas G supplied by the gas supply line 380 may block some of the heat of the reflective plate 360 heated by the lamp 342 from being transmitted to the cooling plate 370. Further, some of the heat of the reflective plate 360 may be transmitted to the gas G and discharged to the outside through the discharge hole 314*a*. That is, according to the exemplary embodiment of the present invention, the partial region of the upper surface of the cooling plate 370 is in contact with the reflective plate 360 and the inert gas G is supplied to the space between the cooling plate 370 and the reflective plate 360, thereby maximally suppressing the boiling phenomenon of the cooling water flowing in the cooling flow path 372. That is, according to the exemplary embodiment of the present invention, the reflective plate 360 is effectively cooled or the heat of the reflective plate 360 is prevented from being transmitted to the spin driving unit 320 by the water cooling-type cooling method having reflectively better cooling efficiency than the air cooling-type cooling method (this is because specific heat of the cooling water used in the water cooling-type cooling method is larger than specific heat of cooling gas used in the air cooling-type cooling method), and the boiling phenomenon of the cooling water incurable when the water cooling-type cooing method is adopted may be maximally suppressed by the air cooling-type cooling method that supplies the inert gas G. That is, it is possible to maximally suppress the heat from being transmitted to the spin driving unit 320, thereby stably performing the treatment process for the substrate W for a longer period of time. Further, the cooling plate 370 selected from the plurality of cooling plates 370 having different contact areas that are in contact with the reflective plate 360 is disposed in the internal space 317, thereby selectively controlling a cooling effect for the reflective plate 360. This is because the degree of heat condition is changed according to the contact area between the cooling plate 370 and the reflective plate 360.

Further, as described above, the blocking protrusion 312*a* formed in the chuck stage 312 may prevent the treatment liquid supplied by the liquid supply unit 400 from being introduced to the internal space 317 of the chuck 310. Further, the inert gas G supplied by the gas supply line 380 may flow in a direction heading the external space of the chuck 310 from the internal space 317 of the chuck 310 through the discharge hole 314*a*. Further, the inert gas G supplied by the gas supply line 380 may make the pressure of the internal space 317 of the chuck 310 be relatively positive when compared with the external space of the chuck 310. Accordingly, even when the substrate W rotates at a relatively low speed, it is possible to maximally suppress the treatment liquid supplied by the liquid supply unit 400 from being introduced into the internal space of the chuck 310.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A support unit for supporting a substrate, the support unit comprising:

a heater configured to transmit thermal energy to a supported substrate;

a chuck stage coupled to a spin driving unit to be rotatable;

a reflective plate entirely disposed under the heater and configured to reflect thermal energy generated by the heater to the substrate;

a cooling plate entirely disposed under the reflective plate and formed with a cooling flow path, disposed below the heater, in which a cooling fluid flows; and a window which is disposed above the chuck stage, and is combined with the chuck stage to form an internal space in which the heater, the reflective plate, and the cooling plate are disposed; and a gas supply line configured to supply gas to a space between the reflective plate and the cooling plate, wherein the cooling fluid is in a liquid state, wherein an upper surface of the cooling plate has:

a contact portion which is in contact with the reflective plate; and a spaced portion which is spaced apart from the reflective plate to form the space, wherein the contact portion includes:

a first contact portion extending from an opening to an edge region of the cooling plate; and a plurality of second contact portions formed in the edge region of the cooling plate, wherein the second contact portions are spaced apart from each other, and wherein regions between adjacent second contact portions and regions between the second contact portions and the first contact portion form discharge openings through which the gas is discharged.

2. The support unit of claim 1, wherein, when viewed from above, a ratio of the contact portion to the spaced portion per unit area is greater in an edge region of the cooling plate than a center region of the cooling plate.

3. The support unit of claim 1, wherein the gas supply line includes:

a first gas supply line which supplies the gas to the space; and a second gas supply line which supplies the gas to a lower portion of the cooling plate.

4. The support unit of claim 1, wherein in a lateral surface of the window, a discharge hole through which the gas supplied by the gas supply line is discharged is formed.

5. The support unit of claim 1, wherein, when viewed from above, in an edge region of the chuck stage, a blocking protrusion which blocks external impurities from being introduced into the internal space is formed.

6. The support unit of claim 5, wherein the blocking protrusion is provided so as to surround the cooling plate when viewed from above, and an upper end of the blocking protrusion is provided to be spaced apart from the reflective plate.

7. The support unit of claim 1, wherein the spin driving unit is provided with a hollow rotation shaft having a hollow space, and wherein at least one of the gas supply line, a fluid supply line supplying the cooling fluid to the cooling flow path, and a fluid discharge line discharging the cooling fluid from the cooling flow path is provided to the hollow space.

8. The support unit of claim 1, wherein the chuck stage and the window are coupled with each other to be rotated by rotation of the spin driving unit, and the heater, the reflective plate, and the cooling plate are positioned independently from the rotation of the chuck stage and the window.

9. The support unit of claim 1, wherein a ratio of the contact portion to the spaced portion per unit area is greater in the edge region of the cooling plate than in the center region of the cooling plate.

10. The support unit of claim 9, wherein the edge region of the cooling plate is in more contact with the reflective plate than the center region as a result of that the edge region holds higher amount of thermal energy generated by the heater due to a lateral surface of a quartz window compared to the center region.

11. The support unit of claim 10, wherein a temperature of the edge region of the reflective plate is higher than a temperature of the center region of the reflective plate.

12. An apparatus for treating a substrate, the apparatus comprising:

a support unit configured to support a substrate; and a liquid supply unit configured to supply a treatment liquid to the substrate supported by the support unit, wherein the support unit includes:

a heater configured to transmit thermal energy to the substrate supported by the support unit;

a chuck stage coupled to a spin driving unit to be rotatable;

a reflective plate entirely disposed under the heater and configured to reflect thermal energy generated by the heater to the substrate;

a cooling plate entirely disposed under the reflective plate and formed with a cooling flow path, disposed below the heater, in which a cooling fluid flows; and a window which is disposed above the chuck stage, and is combined with the chuck stage to form an internal space in which the heater, the reflective plate, and the cooling plate are disposed, wherein the cooling fluid is in a liquid state, wherein an upper surface of the cooling plate has:

a contact portion which is in contact with the reflective plate; and a spaced portion which is spaced apart from the reflective plate to form a space, wherein the contact portion includes:

a first contact portion extending from an opening to an edge region of the cooling plate; and a plurality of second contact portions formed in the edge region of the cooling plate, wherein the second contact portions are spaced apart from each other, and wherein regions between adjacent second contact portions and regions between the second contact portions and the first contact portion form discharge openings through which inert gas is discharged.

13. The apparatus of claim 12, wherein the support unit further includes a gas supply line which supplies inert gas to the space.

14. The apparatus of claim 13, wherein the gas supply line includes:

a first gas supply line which supplies the inert gas to the space; and a second gas supply line which supplies the inert gas to a lower portion of the cooling plate.

15. The apparatus of claim 13, wherein in a lateral surface of the window, a discharge hole through which the inert gas supplied by the gas supply line is discharged is formed.

16. The apparatus of claim 15, wherein when viewed from above, in an edge region of the chuck stage, a blocking protrusion which blocks external impurities from being introduced into the internal space is formed.

17. The apparatus of claim 12, wherein when viewed from above, a ratio of the contact portion to the spaced portion per unit area is greater in an edge region of the cooling plate than a center region of the cooling plate.

18. An apparatus for treating a substrate, the apparatus comprising:

a chamber having a treatment space;

a support unit configured to support and rotate a substrate in the treatment space; and a liquid supply unit configured to supply a treatment liquid to the substrate supported by the support unit, wherein the support unit includes:

a chuck stage coupled to a spin driving unit to be rotatable; and a quarts window which is disposed above the chuck stage, and is combined with the chuck stage to form an internal space;

a heater disposed in the internal space and configured to transmit thermal energy to the substrate supported by the support unit;

a reflective plate entirely disposed under the heater and configured to reflect thermal energy generated by the heater to the substrate supported by the support unit;

a cooling plate entirely disposed under the reflective plate and formed with a cooling flow path, disposed below the heater, in which a cooling fluid flows; and a gas supply line configured to supply inert gas to a space between the reflective plate and the cooling plate, wherein the cooling fluid is in a liquid state, wherein an upper surface of the cooling plate has:

a contact portion which is in contact with the reflective plate; and a spaced portion which is spaced apart from the reflective plate to form the space, wherein the contact portion includes:

a first contact portion extending from an opening to an edge region of the cooling plate; and a plurality of second contact portions formed in the edge region of the cooling plate, wherein the second contact portions are spaced apart from each other, and wherein regions between adjacent second contact portions and regions between the second contact portions and the first contact portion form discharge openings through which the inert gas is discharged.

19. The apparatus of claim 18, wherein the heater is provided in plurality of heaters, and each of the heaters is provided to have a ring shape, and a power supply terminal transmitting power to each of the heaters is installed in the cooling plate.

20. The apparatus of claim 18, wherein in a lateral surface of the window, a discharge hole through which the inert gas supplied by the gas supply line is discharged is formed, when viewed from above, in an edge region of the chuck stage, a blocking protrusion which blocks external impurities from being introduced into the internal space is formed, the blocking protrusion is provided so as to surround the cooling plate when viewed from above, and an upper end of the blocking protrusion is provided to be spaced apart from the reflective plate.

* * * * *